(12) United States Patent
Vasilache et al.

(10) Patent No.: US 11,176,953 B2
(45) Date of Patent: Nov. 16, 2021

(54) EFFICIENT STORAGE OF MULTIPLE STRUCTURED CODEBOOKS

(71) Applicant: Nokia Technologies Oy, Espoo (FI)

(72) Inventors: Adriana Vasilache, Tampere (FI); Anssi Ramo, Tampere (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 38 days.

(21) Appl. No.: 16/620,059

(22) PCT Filed: May 24, 2018

(86) PCT No.: PCT/FI2018/050392
§ 371 (c)(1),
(2) Date: Dec. 6, 2019

(87) PCT Pub. No.: WO2018/224727
PCT Pub. Date: Dec. 13, 2018

(65) Prior Publication Data
US 2020/0202877 A1 Jun. 25, 2020

(30) Foreign Application Priority Data

Jun. 7, 2017 (EP) .................................... 17174664
Jun. 28, 2017 (EP) .................................... 17178315

(51) Int. Cl.
*G10L 19/038* (2013.01)
*G06F 7/76* (2006.01)
(Continued)

(52) U.S. Cl.
CPC .............. *G10L 19/038* (2013.01); *G06F 7/76* (2013.01); *H03M 7/3082* (2013.01); *G10L 2019/0005* (2013.01)

(58) Field of Classification Search
CPC .................................................... G10L 19/038
See application file for complete search history.

(56) References Cited

U.S. PATENT DOCUMENTS

2009/0304296 A1 12/2009 Zhang et al.
2014/0052440 A1* 2/2014 Vasilache ............ H03M 7/3082
704/230

(Continued)

FOREIGN PATENT DOCUMENTS

CA 2991341 A1 1/2017
CN 101145787 A * 3/2008
(Continued)

OTHER PUBLICATIONS

"Multiple-Scale Leader-Lattice VQ with Application to LSF Quantization", Signal Processing, vol. 82, No. 4, Apr. 2002, pp. 563-586.

(Continued)

*Primary Examiner* — Feng-Tzer Tzeng
(74) *Attorney, Agent, or Firm* — Alston & Bird LLP

(57) ABSTRACT

It is inter alia disclosed an apparatus comprising: a table comprising a plurality of sub vectors, wherein each entry of the table is a subvector and each subvector have vector components which are the same as vector components of one or more basis code vectors; and a further table wherein an entry of the further table comprises a first pointer pointing to a sub vector in the table and a second pointer pointing to a subvector in the table, wherein the first pointer and the second pointer are arranged in the further table such that when vector components of the sub vector pointed to by the first pointer are combined with vector components of the sub vector pointed to by the second pointer a basis code vector is formed.

21 Claims, 3 Drawing Sheets

(51) Int. Cl.
*H03M 7/30* (2006.01)
*G10L 19/00* (2013.01)

(56) References Cited

U.S. PATENT DOCUMENTS

| | | |
|---|---|---|
| 2014/0129216 A1 | 5/2014 | Vasilache et al. |
| 2016/0322058 A1 | 11/2016 | Grancharov et al. |
| 2016/0350110 A1 | 12/2016 | Craver et al. |
| 2018/0270602 A1 | 9/2018 | Laaksonen |

FOREIGN PATENT DOCUMENTS

| | | |
|---|---|---|
| EP | 2339754 A1 | 6/2011 |
| WO | 2009/022193 A2 | 2/2009 |
| WO | 2013/005065 A1 | 1/2013 |

OTHER PUBLICATIONS

Extended European Search Report received for corresponding European Patent Application No. 17174664.7, dated Aug. 11, 2017, 11 pages.

"LP-based Coding", 3GPP TS 26.445, V13.0.0, Dec. 2015, pp. 135-211.

Vasilache, "Fast Low Bit Rate Lattice Entropy Coding for Speech and Audio Coding", 19th European Signal Processing Conference, Aug. 29-Sep. 2, 2011, pp. 719-723.

Clark et al., "DSP56300 Family Manual—Chapter 4—Address Generation Unit", Motorola, Aug. 1999, 16 Pages.

Extended European Search Report received for corresponding European Patent Application No. 17178315.2, dated Sep. 19, 2017, 12 pages.

International Search Report and Written Opinion received for corresponding Patent Cooperation Treaty Application No. PCT/FI2018/050392, dated Sep. 7, 2018, 14 pages.

Gkioulekas et al., "Matlab Mini Manual", Thesis, 1997, 49 pages.

"Universal Mobile Telecommunications System (UMTS); LTE; Codec for Enhanced Voice Services (EVS); Detailed algorithmic description (3GPP TS 26.445 version 13.4.1 Release 13)", ETSI TS 126 445, V13.4.1, Apr. 2017, pp. 1-660.

Office action received for corresponding European Patent Application No. 17178315.2, dated Oct. 22, 2019, 4 pages.

* cited by examiner

US 11,176,953 B2

EFFICIENT STORAGE OF MULTIPLE STRUCTURED CODEBOOKS

RELATED APPLICATION

This application was originally filed as Patent Cooperation Treaty Application No. PCT/FI2018/050392 filed 24 May 2018 which claims priority benefit to European Patent Application No. 17178315.2, filed 28 Jun. 2017 and European Patent Application No. 17174664.7, filed 7 Jun. 2017.

FIELD

Embodiments of this invention relate to coding, in particular to speech and audio coding.

BACKGROUND

Low complexity algorithms for speech and audio coding constitute a very relevant asset, for instance for mobile terminal based communications. Due to low storage and low complexity, while preserving coding efficiency, structured codebooks may be preferred in several state of the art speech and audio codecs, like for instance the Enhanced Voice Service (EVS) codec to be standardized within the Third Generation Partnership Project (3GPP).

Codebooks used within these speech and audio codecs may for instance be based on lattice structures, as described in reference "Multiple-scale leader-lattice VQ with application to LSF quantization" by A. Vasilache, B. Dumitrescu and I. Tabus, Signal Processing, 2002, vol. 82, pages 563-586, Elsevier, which is incorporated herein in its entirety by reference.

It is possible to define a lattice codebook as a union of leader classes, each of which is characterized by a leader vector. A leader vector is an n-dimensional vector (with n denoting an integer number), whose (e.g. positive) components are ordered (e.g. decreasingly). The leader class corresponding to the leader vector then consists of the leader vector and all vectors obtained through all the signed permutations of the leader vector (with some possible restrictions). It is also possible that one, some or all leader classes are respectively associated with one or more scales, and the lattice codebook is then formed as a union of scaled and/or unscaled leader classes.

An input vector may for instance be encoded (for instance in quantization) by finding the nearest neighbour code vector in the codebook, i.e. the code vector that has the smallest distance with respect to the input vector. An identifier of this code vector (e.g. an index assigned to this code vector) then may serve as an encoded representation of the input vector.

SUMMARY OF SOME EMBODIMENTS OF THE INVENTION

Although the use of structured codebooks already reduces the amount of memory and the computational complexity required for encoding an input vector, further reduction of memory requirements is always desirable especially for ROM based memory in which the structured codebooks are typically stored.

There is provided according to the application an apparatus comprising: a table comprising a plurality of sub vectors, wherein each entry of the table is a sub vector and each sub vector have vector components which are the same as vector components of one or more basis code vectors; and a further table wherein an entry of the further table comprises a first pointer pointing to a sub vector in the table and a second pointer pointing to a sub vector in the table, wherein the first pointer and the second pointer are arranged in the further table such that when vector components of the sub vector pointed to by the first pointer are combined with vector components of the sub vector pointed to by the second pointer a basis code vector is formed.

The vector components may be a group of contiguous vector components.

A value of the first pointer pointing to a sub vector in the table and a value of the second pointer pointing to a sub vector in the table may be integers of modulo n, n may be related to the maximum value of the data type assigned for storage of the value of the first pointer and the value of the second pointer.

When the value of the first pointer is greater than or equal to the value of the second pointer the first pointer may point to a sub vector in the table at the location given by the value of the first pointer, and when the value of the first pointer is less than the value of the second pointer the first pointer may point to a sub vector in the table at the location given by addition of the value of the first pointer to n.

The table and the further table may form part of an audio/speech codec, the audio/speech codec may operate in a plurality of operating modes or operating coding rates.

Use of integers of modulo n for the value of the first pointer and the value of the second pointer maybe dependent on a particular operating mode or operating coding rate of the audio/speech codec.

The data type may be an unsigned character data type, and wherein n is 256.

The basis code vector may be a leader class, and each leader class may comprise a leader vector and permutations of the leader vector.

The one or more basis code vectors may be a set of basis code vectors which define a structured codebook, and the set of basis vectors may be leader classes, each leader class may comprise a different leader vector and permutations of said leader vector.

The table may form part of a Third Generation Partnership Project Long Term Evolution speech Enhanced Voice Service codec.

According to a further aspect there is provided a method comprising forming a basis code vector by combining vector components of a sub vector pointed to by a first pointer with vector components of a sub vector pointed to by a second pointer, wherein the sub vector pointed to by the first pointer and the sub vector pointed to by the second pointer are contained in a table comprising a plurality of sub vectors, wherein each entry of the table is a sub vector and each sub vector have vector components which are the same as vector components of one or more basis code vectors, wherein the first pointer and the second pointer are contained in a further table wherein an entry of the further table comprises the first pointer pointing and the second pointer.

The vector components may be a group of contiguous vector components.

A value of the first pointer pointing to a sub vector in the table and a value of the second pointer pointing to a sub vector in the table may be integers of modulo n, n may be related to the maximum value of the data type assigned for storage of the value of the first pointer and the value of the second pointer.

When the value of the first pointer is greater than or equal to the value of the second pointer the first pointer may point to a sub vector in the table at the location given by the value of the first pointer, and when the value of the first pointer is less than the value of the second pointer the first pointer may point to a sub vector in the table at the location given by addition of the value of the first pointer to n.

The table and the further table may form part of an audio/speech codec, the audio/speech codec may operate in a plurality of operating modes or operating coding rates.

Use of integers of modulo n for the value of the first pointer and the value of the second pointer maybe dependent on a particular operating mode or operating coding rate of the audio/speech codec.

The data type may be an unsigned character data type, and wherein n is 256.

The basis code vector may be a leader class, and each leader class may comprise a leader vector and permutations of the leader vector.

The one or more basis code vectors may be a set of basis code vectors which define a structured codebook, and the set of basis vectors may be leader classes, each leader class may comprise a different leader vector and permutations of said leader vector.

According to another aspect there is provided an apparatus comprising at least one processor and at least one memory including computer program code, the at least one memory and the computer program code configured to, with the at least one processor, cause the apparatus to form a basis code vector by combining vector components of a sub vector pointed to by a first pointer with vector components of a sub vector pointed to by a second pointer, wherein the sub vector pointed to by the first pointer and the sub vector pointed to by the second pointer are contained in a table comprising a plurality of sub vectors, wherein each entry of the table is a sub vector and each sub vector have vector components which are the same as vector components of one or more basis code vectors, wherein the first pointer and the second pointer are contained in a further table wherein an entry of the further table comprises the first pointer and the second pointer.

The vector components may be a group of contiguous vector components.

A value of the first pointer pointing to a sub vector in the table and a value of the second pointer pointing to a sub vector in the table may be integers of modulo n, n may be related to the maximum value of the data type assigned for storage of the value of the first pointer and the value of the second pointer.

When the value of the first pointer is greater than or equal to the value of the second pointer the first pointer may point to a sub vector in the table at the location given by the value of the first pointer, and when the value of the first pointer is less than the value of the second pointer the first pointer may point to a sub vector in the table at the location given by addition of the value of the first pointer to n.

The table and the further table may form part of an audio/speech codec, the audio/speech codec may operate in a plurality of operating modes or operating coding rates.

Use of integers of modulo n for the value of the first pointer and the value of the second pointer maybe dependent on a particular operating mode or operating coding rate of the audio/speech codec.

The data type may be an unsigned character data type, and wherein n is 256.

The basis code vector may be a leader class, and each leader class may comprise a leader vector and permutations of the leader vector.

The one or more basis code vectors may be a set of basis code vectors which define a structured codebook, and the set of basis vectors may be leader classes, each leader class may comprise a different leader vector and permutations of said leader vector.

According to another aspect there is provided a computer program code for forming a basis code vector by combining vector components of a sub vector pointed to by a first pointer with vector components of a sub vector pointed to by a second pointer, wherein the sub vector pointed to by the first pointer and the sub vector pointed to by the second pointer are contained in a table comprising a plurality of sub vectors, wherein each entry of the table is a sub vector and each sub vector have vector components which are the same as vector components of one or more basis code vectors, wherein the first pointer and the second pointer are contained in a further table wherein an entry of the further table comprises the first pointer pointing and the second pointer.

According to another aspect there is provided a computer-readable medium having computer-readable code stored thereon, the computer readable code, when executed by a least one processor, causing an apparatus to form a basis code vector by combining vector components of a sub vector pointed to by a first pointer with vector components of a sub vector pointed to by a second pointer, wherein the sub vector pointed to by the first pointer and the sub vector pointed to by the second pointer are contained in a table comprising a plurality of sub vectors, wherein each entry of the table is a sub vector and each sub vector have vector components which are the same as vector components of one or more basis code vectors, wherein the first pointer and the second pointer are contained in a further table wherein an entry of the further table comprises the first pointer pointing and the second pointer.

BRIEF DESCRIPTION OF THE FIGURES

For better understanding of the present application and as to how the same may be carried into effect, reference will now be made by way of example to the accompanying drawings in which.

DETAILED DESCRIPTION OF EMBODIMENTS

Figure 1A:
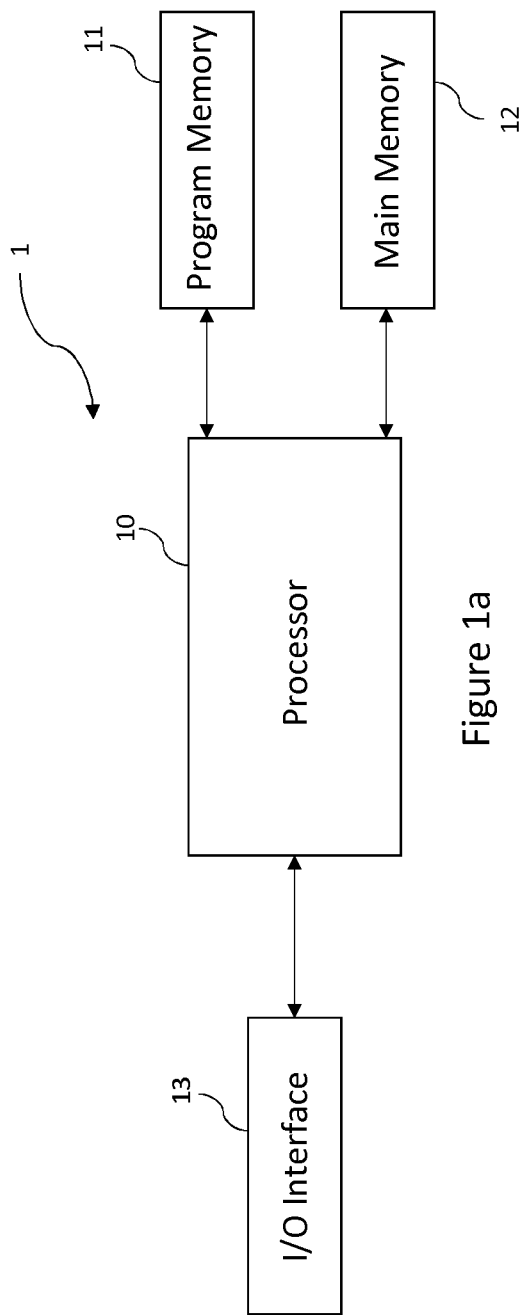
FIG. 1a shows a schematic illustration of an apparatus according to an embodiment of the invention.
Figure 1B:
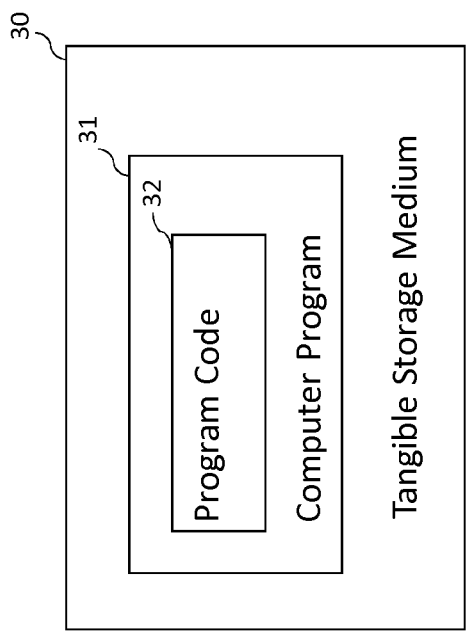
FIG. 1b shows a tangible storage medium according to an embodiment of the invention.

FIG. 1 schematically illustrates components of an apparatus 1 according to an embodiment of the invention. Apparatus 1 may for instance be an electronic device that is for instance capable of encoding at least one of speech, audio and video signals, or a component of such a device. Apparatus 1 is in particular configured to determine a code vector for encoding an input vector. Apparatus 1 may for instance be embodied as a module. Non-limiting examples of apparatus 1 are a mobile phone, a personal digital assistant, a portable multimedia (audio and/or video) player, and a computer (e.g. a laptop or desktop computer).

Apparatus 1 comprises a processor 10, which may for instance be embodied as a microprocessor, Digital Signal Processor (DSP) or Application Specific Integrated Circuit (ASIC), to name but a few non-limiting examples. Processor 10 executes a program code stored in program memory 11, and uses main memory 12 as a working memory, for instance to at least temporarily store intermediate results, but also to store for instance pre-defined and/or pre-computed databases. Some or all of memories 11 and 12 may also be included into processor 10. Memories 11 and/or 12 may for instance be embodied as Read-Only Memory (ROM), Random Access Memory (RAM), to name but a few non-limiting examples. One of or both of memories 11 and 12 may be fixedly connected to processor 10 or removable from processor 10, for instance in the form of a memory card or stick.

Processor 10 further controls an input/output (I/O) interface 13, via which processor receives or provides information to other functional units.

As will be described below, processor 10 is at least capable to execute program code for determining a code vector for encoding an input vector. However, processor 10 may of course possess further capabilities. For instance, processor 10 may be capable of at least one of speech, audio and video encoding, for instance based on sampled input values. Processor 10 may additionally or alternatively be capable of controlling operation of a portable communication and/or multimedia device.

Apparatus 1 of FIG. 1 may further comprise components such as a user interface, for instance to allow a user of apparatus 1 to interact with processor 10, or an antenna with associated radio frequency (RF) circuitry to enable apparatus 1 to perform wireless communication.

The circuitry formed by the components of apparatus 1 may be implemented in hardware alone, partially in hardware and in software, or in software only, as further described at the end of this specification.

Figure 2:
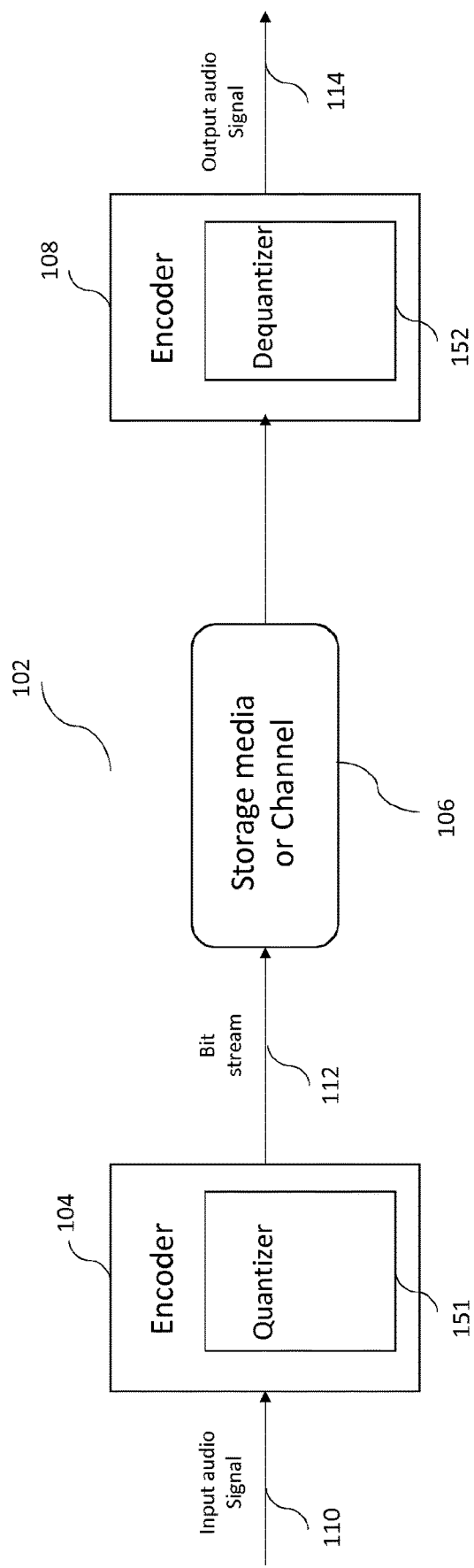
FIG. 2 shows an audio codec system according to some embodiments.
Figure 3:
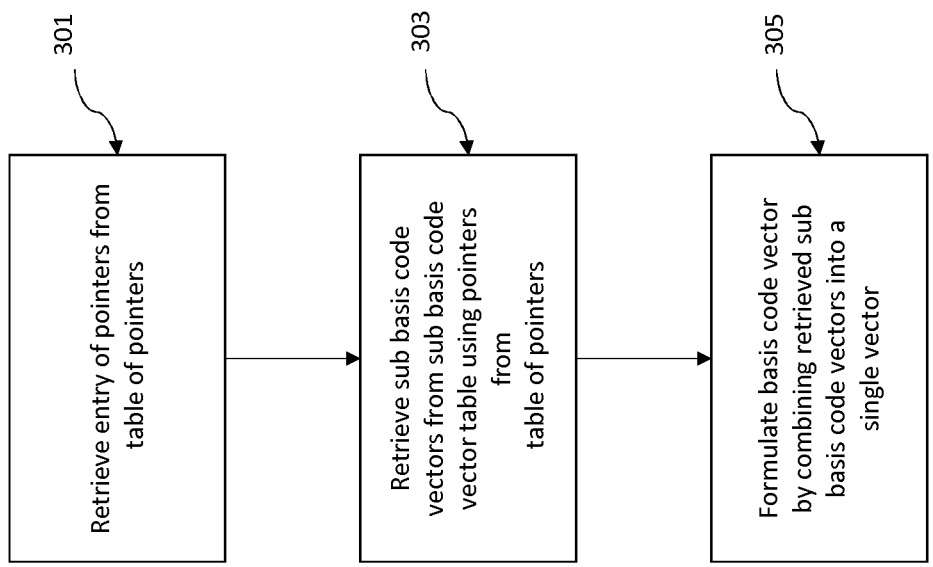
FIG. 3 shows a flowchart of a method according to an embodiment of the invention.

It would be appreciated that the schematic structures described in FIGS. 1 to 2, and the method steps shown in FIG. 3 represent only a part of an audio codec and specifically part of a quantizer and dequantizer embedded within an encoder/decoder apparatus or as exemplarily shown implemented in the apparatus shown in FIG. 1.

The general operation of audio codecs as employed by embodiments is shown in FIG. 2. General audio coding/decoding systems comprise both an encoder and a decoder, as illustrated schematically in FIG. 2. However, it would be understood that some embodiments can implement one of either the encoder or decoder, or both the encoder and decoder. Illustrated by FIG. 2 is a system 102 with an encoder 104 and in particular an encoder implementing structured codebooks are described herein, a storage or media channel 106 and a decoder 108. It would be understood that as described above some embodiments can comprise or implement one of the encoder 104 or decoder 108 or both the encoder 104 and decoder 108.

The encoder 104 compresses an input audio signal 110 producing a bit stream 112, which in some embodiments can be stored or transmitted through a media channel 106. The bit stream 112 can be received within the decoder 108. The decoder 108 decompresses the bit stream 112 and produces an output audio signal 114. The bit rate of the bit stream 112 and the quality of the output audio signal 114 in relation to the input signal 110 are the main features which define the performance of the coding system 102.

The encoder 104 and decoder 108 can comprise a quantizer 151 and dequantizer 152 for quantizing and dequantizing coefficients and parameters of the audio coding process. For instance parameters of the audio coding process may include but not limited to transformed representations of Linear Prediction Coefficients (LPC). For example such transformed representations of LPCs may at least comprise one of the following; Line spectral frequencies (LSF), Line Spectral Pairs (LSP) or Immittance Spectral Pairs (ISP). The foregoing may be represented as vectors comprising a number of vector components.

A structured codebook of the quantizer 151 and dequantizer 152 may be defined by a set of basis code vectors with each basis code vector of the set of basis code vectors defining a respective further set of basis code vectors. In a structured codebook the respective further set of basis code vectors may be formed from the basis code vector with which it is associated. Accordingly, the structured codebook can be represented in the quantizer 151 and dequantizer 152 by a table comprising the set of basis code vectors which define said structured codebook.

In embodiments, the table comprising the set of basis code vectors defining the structured codebook may be efficiently stored in the apparatus 1 as a table having a plurality of sub basis code vectors. Each sub basis code vector comprises a contiguous set of components from a basis code vector of the structured codebook with a fewer number of components.

It can be realized that less memory can be used for storing the basis code vectors which define the structured codebook by noting that the basis code vectors comprise patterns of contiguous sets of vector components which are repeated throughout the set of basis code vectors. In embodiments these repetitive patterns may be exploited by having sub code basis vectors whose components are the repetitive component patterns present across the set of basis code vectors.

By way of further explanation using a C-source example, a structured codebook may be defined by the following basis code vectors. It should be observed that each basis code vector in this particular example has a vector dimension of six.

```
int no_lead[ ][ ] = { . . .
    { 1, 0, 0, 1, 0, 0, },
    { 2, 0, 0, 1, 0, 0, },
    { 4, 2, 0, 1, 0, 0, },
    { 2, 0, 0, 2, 2, 0, },
    { 4, 2, 0, 2, 0, 0, },
    { 7, 5, 2, 2, 2, 0, },
    { 8, 7, 2, 2, 2, 0, },
    . . . .
    { 5, 4, 0, 0, 0, 0, },
    { 7, 5, 2, 0, 0, 0, },
    { 1, 0, 0, 1, 0, 0, }, ...};
```

In this case the table of sub basis code vectors may be based on a vector dimension of three, half that of the basis code vectors of the structured codebook, and may comprise the following sub basis code vectors.

```
char leaders_short[ ][ ] = {
    { 1, 0, 0 },
    { 2, 0, 0 },
    { 4, 0, 0 },
    { 2, 1, 0 },
    { 4, 1, 0 },
    { 2, 2, 0 },
    { 3, 2, 0 },
    { 4, 2, 0 },
    { 5, 2, 0 },
    { 6, 3, 0 },
    { 7, 3, 0 },
    { 8, 3, 0 },
    { 9, 3, 0 },
    . . .};
```

In this particular example the first basis code vector used to define the structured codebook can be represented as the first sub basis code vector {1, 0, 0} in the sub basis code vector table. In other words first group of components 0 to 2 and the second group of components 3 to 5 of the first basis code vector used to define the structured codebook can both be represented by the first sub basis code vector.

Taking another case using this particular example the second basis code vector used to define the structured codebook can be represented by the second sub basis code vector {2, 0, 0} followed by the first sub basis code vector {1, 0, 0}.

The mapping which specifies how each basis code vector is formed from the sub basis code vector table may be contained as a table of pointers, whereby each entry in the table of pointers specifies the sub basis code vectors required to formulate a particular basis code vector in the form of a number of pointers to entries in the sub basis code vector table. The number of pointers in each entry in the table of pointers is commensurate with the number of sub basis code vectors required to formulate the basis code vector associated with that particular entry in the table of pointers.

The sub basis code vectors pointed to by a particular entry from the table of pointers are combined into a single basis code vector.

Returning to the above C-source example as by way of explanation we can formulate the table of pointers as

```
short lead_p_idx[ ][ ] = {
    { 0, 0 },
    { 1, 0 },
    { 7, 0 },
    { 1, 5 },
    { 7, 2 },
    . . . };
```

In this case each entry is formed of two integers, with each integer pointing to an entry in the sub basis code vector table. In the above example the first basis code vector defining the structured codebook is therefore given as the first entry in the table of pointers. In this case the first integer points to the entry "0" of the sub basis code vector table thereby denoting that the first three components 0 to 2 of the basis code vector is the sub basis code vector associated with the first entry of the sub basis code vector table. The second integer also points to the entry "0" of the sub basis code vector table thereby also denoting that the second three components 3 to 5 of the basis code vector is the sub basis code vector associated with the first entry of the sub vector table.

Therefore is to be appreciated that the table of basis code vectors used to define a structured codebook can be stored in the form of a sub basis code vector table together with an additional pointer table comprising entries which point to sub basis code vector entries in the sub basis code vector table. This can result in the technical benefit of requiring less memory to store the basis code vectors used to define the structured codebook since the sub basis code vector table together with the additional pointer table requires less storage.

Furthermore the processor 10 in the apparatus 1 may be arranged to perform the method of formulating a basis code vector by combining sub basis code vectors from the sub basis code vector table, where the sub basis code vectors used to formulate a particular basis code vector are specified by an entry from the table of pointers as outlined above.

Accordingly, FIG. 3 shows the processing steps that may be performed by a processor such as that depicted as 10 in FIG. 1.

Processing step 301 shows the step of retrieving a particular entry from the table of pointers which specify the basis code vector.

Processing step 303 shows the step of retrieving a plurality sub basis code vectors from the sub basis code vector table. Each sub basis code vector is retrieved using a pointer given by the entry from the table of pointers from step 301.

Processing step 305 shows the step of combining the retrieved sub basis code vectors into a basis code vector. The order of placement of the sub basis code vectors to form the basis code vector is given by the order of the pointers as provided by the entry from the table of pointers.

Typically the memory used to hold quantization tables and the like may take the form of Read Only Memory (ROM).

For example, for a particular implementation of the 3GPP standardized Enhanced Voice Service (EVS) employing a total of 406 quantizer structures the table ROM consumption is of the order of 4.872 K 16 bit words when using the full tables to store the set of basis code vectors. However, this figure reduces to 3.797 k 16 bit words when the above structure of sub code basis vector table and accompanying pointer table is used.

In order to further reduce the memory requirements for storing the above quantization tables, the table of pointers which is depicted as lead_p_idx in the specific C-source code example given above is currently shown as storing each member using the data type short which is a signed 16 bit word having a possible range of values from −32,768 to 32,767. Alternatively in some embodiments the table of pointers can use the data type unsigned char (uchar) to store the members of the table. In this instance each member or number of the table of pointers is stored as an unsigned 8 bit number, and accordingly each number is limited to a possible range of values from 0 to 255. This would half the storage required for the table of pointers (lead_p_idx) when compared to using a 16 bit word storage type.

It is advantageous to appreciate at this point that many audio/speech codecs such the Third Generation Partnership Project (3GPP) standardized EVS codec are designed to operate over a plethora of bit/coding rates and operating modes, and that each operating mode and source bit rate may require a particular structured codebook tailored to the particular operating conditions. Within the context of the above description an audio/speech codec operating within this manner (such as the EVS codec) may utilize many different structured codebooks, and each structured codebook may require a different number of basis code vectors in order to define said structured codebook.

Taking for example the leader_short table from above which contain the sub basis code vectors which are used to form the basis code vectors for defining a particular structured codebook. In some operating modes access may be required to entries in the sub basis code vector table (leader_short) which exceed 255. For these cases the uchar value which points to the entry in the sub basis code vector table (leader_short) would not be able to directly point to any entry in that table which is higher than 255.

For these operating modes (or coding bitrates) of the audio codec the table of pointers (lead_p_idx) may be arranged to use modulo arithmetic for the purpose of storing values higher than the maximum number allowed for by the data type assigned to the pointer value. In other words the value assigned to the pointer can be "wrapped around" when the pointer value exceeds the maximum range of its assigned data type. For example, using the above situation in which the data type used to store the pointers values is of the type uchar the numbers can be stored according to modulo 256 arithmetic, such that pointers which are required to point to entries in the sub basis code vector table greater than 256 are assigned the pointer values 0, 1, 2 . . . .

The actual value of the pointer can be obtained by adding the modulus to the value of the stored pointer. So carrying on with the above example the actual pointer value can be obtained by adding 256 to the stored value in the table of pointers.

It is to be appreciated that the above mechanism of using modulo arithmetic to extend the range of possible pointer values from the table of pointers is dependent on the operating mode (or operating bit rate) of the audio/speech codec. That is for some operating modes (or operating bit rates) access may be required to regions of the sub basis code vector table which go beyond the number range of the assigned data type used to store the pointer value.

Other embodiments may extend the effective maximum value allowed by the data type assigned to pointers by ensuring that each entry of the table of pointers follow a specific rule or pattern. For instance, the relative values of the pointers in each entry of the table may be used to indicate whether the pointers for the particular entry can be treated as either a value which is within the number range of the data type, or a value which represents a number beyond the standard number range of the data type and thereby requiring further processing to obtain the true value.

The signalling required to indicate whether the pointer value in the table of pointers can be treated (or not treated) as a normal number within the number range of the data type can be intrinsically incorporated into the structure of the tables and codebooks. Thereby resulting in no additional signalling overhead. In other words the basis code vectors, and hence the sub basis code vectors of the table sub basis code vector table may be structured such that each entry in the table of pointers has one particular rule/pattern if the pointer values are to be treated as a value within the number range of the data type, and another pattern/rule if the pointer values are to be treated as a value which lies outside the number range of the data type.

For example one such rule/pattern can be achieved by designing the structured codebook such that (for each basis code vector of the structured codebook) when the pointer values in an entry of the table of pointers is to be treated as normal numbers within the number range of the data type, the first sub basis code vector has a pointer value assigned to it in the table of pointers which is either greater or equal to the pointer value assigned to the second sub basis vector. Conversely, when the pointer values in an entry of the table of pointers are to be treated as numbers outside the number range of the data type, a different pattern/rule can be used to store the pointer values. For instance the pattern/rule can be such that when the first sub basis code vector pointer value is less than the second sub basis code vector pointer value the pointer values in the entry of the table should be treated as number values which lies outside of the number range of the data type.

For example using the above C-source code example, and by way of further explanation, the table of sub basis code vectors leaders_short may be structured such that each basis code vector of the structured codebook no_lead has an entry in the table of pointers lead_p_idx as given below. The table of pointers lead_p_idx are of data type uchar

```
unsigned char lead_p_idx [ ][ ] = {
{   0, 0 }, /* actual pointer values */
{   1, 0 }, /* actual pointer values */
{   7, 0 }, /* actual pointer values */
    . . .
{ 100, 65 }, /* actual pointer values */
{ 230, 100 }, /* actual pointer values */
{   4, 100 }, /* first pointer given corresponds to 256+4, 100*/
{  18, 145}, /* fist pointer corresponds to 256+18, 145*/
    . . .
{   7, 2 }, /* actual pointer values */
```

It can be seen that some entries in the table follow the pattern/rule as discussed above of the first pointer value being the same or greater than the second pointer value. This condition may only hold for pointer values which lie within the number range of the data type assigned for storing the pointer value. For instance, as discussed above, if the data type is unsigned char, then the dynamic range of pointer values will lie from 0 to 255. Therefore the stored pointers associated with these particular entries are treated as normal numbers, in that there is no need to perform modulo 256 arithmetic in order to obtain the actual pointer value.

By inspecting the above table lead_p_idx it can be seen that some of the entries have a first pointer value which is less than the second pointer value. As discussed above this particular arrangement of pointers denotes that the stored value of the first pointer in the particular pointer table entry denotes that the first pointer is to be treated as a value which lies outside the number range of the uchar data type, in other words the pointer value is greater than 255. The actual value of the pointer can be obtained by adding the modulus to the value of the stored pointer. This continuing with the above example the actual of the first pointer can be obtained by adding 256 to the stored value in the table of pointers.

In some embodiments, said set of basis code vectors defining the structured codebook may represent leader classes, wherein each leader class comprises a different leader vector and permutations of said leader vector. Thus, said leader vector and the permutations of said leader vector may represent the further set of basis code vectors defined by a basis code vector of the set of basis code vectors. As an example, a leader vector is an n-dimensional vector (with n denoting an integer number), whose (positive) components are ordered (e.g. decreasingly). The leader class corresponding to the leader vector then consists of the leader vector and all vectors obtained through all the signed permutations of the leader vector (with some possible restrictions).

A union of leader classes may be defined by the set of basis code vectors associated with the same scale representation of the plurality of scale representations and the respective scale representation. For instance, a union of leader classes may be associated with a set of code vectors obtained by means of scaling the basis code vectors of the associated step of basis code vectors with the scale representative.

Such a union of leader classes may be considered as a truncation. Thus, if the plurality of scale representations are n scale representations, n unions of leader classes may be defined, wherein each union of leader class is defined by means of the respective scale representation and a group of basis code vectors of the set of basis code vectors associated with the respective scale representation.

Accordingly, the plurality of scale representations and the plurality of groups of basis code vectors may define a plurality of union of leader classes thereby defining a codebook, wherein, as an example, each union of leader classes may be considered as a union of scaled leader classes.

Codebooks used within these speech and audio codecs may for instance be based on lattice structures, as described in reference "Multiple-scale leader-lattice VQ with application to LSF quantization" by A. Vasilache, B. Dumitrescu and I. Tabus, Signal Processing, 2002, vol. 82, pages 563-586, Elsevier, which is incorporated herein in its entirety by reference. For instance, a D10+ lattice may be considered for quantization, but any other well-suited lattice quantization may also be considered.

As used in this application, the term 'circuitry' refers to all of the following:
 (a) hardware-only circuit implementations (such as implementations in only analog and/or digital circuitry) and
 (b) combinations of circuits and software (and/or firmware), such as (as applicable):
  (i) to a combination of processor(s) or
  (ii) to portions of processor(s)/software (including digital signal processor(s)), software, and memory(ies) that work together to cause an apparatus, such as a mobile phone or a positioning device, to perform various functions) and
 (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a positioning device.

With respect to the aspects of the invention and their embodiments described in this application, it is understood that a disclosure of any action or step shall be understood as a disclosure of a corresponding (functional) configuration of a corresponding apparatus (for instance a configuration of the computer program code and/or the processor and/or some other means of the corresponding apparatus), of a corresponding computer program code defined to cause such an action or step when executed and/or of a corresponding (functional) configuration of a system (or parts thereof).

The aspects of the invention and their embodiments presented in this application and also their single features shall also be understood to be disclosed in all possible combinations with each other. It should also be understood that the sequence of method steps in the flowcharts presented above is not mandatory, also alternative sequences may be possible.

The invention has been described above by non-limiting examples. In particular, it should be noted that there are alternative ways and variations which are obvious to a skilled person in the art and can be implemented without deviating from the scope and spirit of the appended claims.

The invention claimed is:

1. An apparatus comprising at least one processor, and at least one memory including computer program code, the at least one memory and the computer program code configured to, with the at least one processor, cause the apparatus to perform:
 forming a basis code vector by combining vector components of a sub vector pointed to by a first pointer with vector components of a sub vector pointed to by a second pointer, wherein the sub vector pointed to by the first pointer and the sub vector pointed to by the second pointer are contained in a table comprising a plurality of sub vectors, wherein the sub vector pointed to by the first pointer and the sub vector pointed to by the second pointer comprise vector components of one or more basis code vectors, wherein the first pointer and the second pointer are contained in a further table wherein an entry of the further table comprises the first pointer and the second pointer, wherein a value of the first pointer pointing to the sub vector in the table and a value of the second pointer pointing to the sub vector in the table are integers of modulo n, wherein n is related to a maximum value of a data type assigned for storage of the value of the first pointer and the value of the second pointer, and wherein when the value of the first pointer is greater than or equal to the value of the second pointer the first pointer points to the sub vector in the table at the location given by the value of the first pointer, and wherein when the value of the first pointer is less than the value of the second pointer the first pointer points to the sub vector in the table at the location given by addition of the value of the first pointer to n; and
 quantizing at least one coefficient based on the basis code vector, wherein the at least one coefficient is from an audio signal.

2. The apparatus as claimed in claim 1, wherein the vector components of the sub vector pointed to by the first pointer are a first group of contiguous vector components of the one or more basis code vectors and vector components of the sub vector pointed to by the second pointer are a second group of contiguous vector components of the one or more basis code vectors.

3. The apparatus as claimed in claim 1, wherein the table and the further table form part of an audio and/or speech codec, wherein the audio and/or speech codec operates in a plurality of operating modes or operating coding rates.

4. The apparatus as claimed in claim 3, wherein use of integers of modulo n for the value of the first pointer and the value of the second pointer is dependent on a particular operating mode or operating coding rate of the audio and/or speech codec.

5. The apparatus as claimed in claim 1, wherein the data type is an unsigned character data type, and wherein n is 256.

6. The apparatus as claimed in claim 1, wherein the basis code vector is a leader class, wherein each leader class comprises a leader vector and permutations of the leader vector.

7. The apparatus as claimed in claim 1, wherein the one or more basis code vectors are a set of basis code vectors which define a structured codebook, and wherein the set of basis code vectors are leader classes, wherein each leader class comprises a different leader vector and permutations of said leader vector.

8. A method comprising:
 forming a basis code vector by combining vector components of a sub vector pointed to by a first pointer with vector components of a sub vector pointed to by a second pointer, wherein the sub vector pointed to by the first pointer and the sub vector pointed to by the second pointer are contained in a table comprising a plurality of sub vectors, wherein the sub vector pointed to by the first pointer and the sub vector pointed to by the second pointer comprise vector components of one or more basis code vectors, wherein the first pointer and the second pointer are contained in a further table wherein an entry of the further table comprises the first pointer and the second pointer, wherein a value of the first pointer pointing to the sub vector in the table and a value of the second pointer pointing to the sub vector in the table are integers of modulo n, wherein n is related to a maximum value of a data type assigned for storage of the value of the first pointer and the value of the second pointer, and wherein when the value of the first pointer is greater than or equal to the value of the second pointer the first pointer points to the sub vector in the table at the location given by the value of the first pointer, and wherein when the value of the first pointer is less than the value of the second pointer the first pointer points to the sub vector in the table at the location given by addition of the value of the first pointer to n; and quantizing at least one coefficient based on the basis code vector, wherein the at least one coefficient is from an audio signal.

9. The method as claimed in claim 8, wherein the vector components of the sub vector pointed to by the first pointer are a first group of contiguous vector components of the one or more basis code vectors and vector components of the sub vector pointed to by the second pointer are a second group of contiguous vector components of the one or more basis code vectors.

10. The method as claimed in claim 8, wherein the table and the further table form part of an audio/speech codec, wherein the audio/speech codec operates in a plurality of operating modes or operating coding rates.

11. The method as claimed in claim 10 wherein use of integers of modulo n for the value of the first pointer and the value of the second pointer is dependent on a particular operating mode or operating coding rate of the audio/speech codec.

12. The method as claimed in claim 8, wherein the data type is an unsigned character data type, and wherein n is 256.

13. The method as claimed in claim 8, wherein the basis code vector is a leader class, wherein each leader class comprises a leader vector and permutations of the leader vector.

14. The method as claimed in claim 8, wherein the one or more basis code vectors are a set of basis code vectors which define a structured codebook, and wherein the set of basis vectors are leader classes, wherein each leader class comprises a different leader vector and permutations of said leader vector.

15. An apparatus comprising at least one processor, and at least one memory including computer program code, the at least one memory is configured to comprise a table comprising a plurality of sub vectors, wherein an entry of the table is a first sub vector comprising components of one or more basis code vectors and wherein a further entry of the table is a second sub vector comprising components of the one or more basis code vectors; and a further table wherein an entry of the further table comprises a first pointer pointing to the first sub vector in the table and a second pointer pointing to the second sub vector in the table, wherein the first pointer and the second pointer are arranged in the further table such that when vector components of the first sub vector pointed to by the first pointer are combined with vector components of the second sub vector pointed to by the second pointer a basis code vector is formed, wherein a value of the first pointer pointing to the sub vector in the table and a value of the second pointer pointing to the sub vector in the table are integers of modulo n, wherein n is related to a maximum value of a data type assigned for storage of the value of the first pointer and the value of the second pointer, and wherein when the value of the first pointer is greater than or equal to the value of the second pointer the first pointer points to the sub vector in the table at the location given by the value of the first pointer, and wherein when the value of the first pointer is less than the value of the second pointer the first pointer points to the sub vector in the table at the location given by addition of the value of the first pointer to n.

16. The apparatus as claimed in claim 15, wherein the vector components of the first sub vector are a first group of contiguous vector components of the one or more basis vectors and vector components of the second sub vector are a second group of contiguous vector components of the one or more basis vectors.

17. The apparatus as claimed in claim 15, wherein the table and the further table form part of an audio/speech codec, wherein the audio/speech codec operates in a plurality of operating modes or operating coding rates.

18. The apparatus as claimed in claim 17, wherein use of integers of modulo n for the value of the first pointer and the value of the second pointer is dependent on a particular operating mode or operating coding rate of the audio/speech codec.

19. The apparatus as claimed in claim 15, wherein the data type is an unsigned character data type, and wherein n is 256.

20. The apparatus as claimed in claim 15, wherein the basis code vector is a leader class, wherein each leader class comprises a leader vector and permutations of the leader vector.

21. The apparatus as claimed in claim 15, wherein the one or more basis code vectors are a set of basis code vectors which define a structured codebook, and wherein the set of basis vectors are leader classes, wherein each leader class comprises a different leader vector and permutations of said leader vector.

* * * * *